US012796175B2

(12) United States Patent
Check et al.

(10) Patent No.: US 12,796,175 B2
(45) Date of Patent: Nov. 10, 2026

(54) LASER ETCHING FOR LIGHT-EMITTING DIODE DEVICES AND RELATED METHODS

(71) Applicant: CreeLED, Inc., Durham, NC (US)

(72) Inventors: Michael Check, Holly Springs, NC (US); David Suich, Durham, NC (US); Colin Blakely, Raleigh, NC (US); Joseph Sokol, Durham, NC (US); Robert Wilcox, Rolesville, NC (US); Andre Pertuit, Raleigh, NC (US)

(73) Assignee: CreeLED, Inc., Durham, NC (US)

( * ) Notice: Subject to any disclaimer, the term of this patent is extended or adjusted under 35 U.S.C. 154(b) by 616 days.

(21) Appl. No.: 18/104,966

(22) Filed: Feb. 2, 2023

(65) Prior Publication Data

US 2024/0266462 A1 Aug. 8, 2024

(51) Int. Cl.
*H10H 20/82* (2025.01)
*H10H 20/01* (2025.01)
(Continued)

(52) U.S. Cl.
CPC ........ *H10H 20/82* (2025.01); *H10H 20/0133* (2025.01); *H10H 20/01335* (2025.01);
(Continued)

(58) Field of Classification Search
CPC .... H10H 20/019; H10H 20/819; H10H 20/82; H10H 20/882
See application file for complete search history.

(56) References Cited

U.S. PATENT DOCUMENTS

| | | | |
|---|---|---|---|
| 8,034,647 | B2 | 10/2011 | Batres et al. |
| 10,903,265 | B2 | 1/2021 | Andrews et al. |

(Continued)

FOREIGN PATENT DOCUMENTS

| | | | | | |
|---|---|---|---|---|---|
| EP | 2595204 | A2 | | 5/2013 | |
| JP | 2019040980 | A | | 3/2019 | |
| KR | 20130066440 | A | * | 6/2013 | ......... H10H 20/8581 |
| TW | 200742118 | A | | 11/2007 | |
| TW | 200837997 | A | | 9/2008 | |
| TW | 1777733 | B | | 9/2022 | |
| WO | 2016016670 | A1 | | 2/2016 | |

OTHER PUBLICATIONS

Examination Report for Taiwanese Patent Application No. 113102867, mailed Jan. 8, 2025, 17 pages.

(Continued)

*Primary Examiner* — Molly K Reida
(74) *Attorney, Agent, or Firm* — Withrow & Terranova, P.L.L.C.

(57) ABSTRACT

Solid-state lighting devices, and more particularly to laser etching light-emitting diode (LED) devices and related methods are disclosed. LED devices that use sapphire substrates are difficult to etch using conventional techniques, but laser etching and ablation of sapphire substrates overcomes these challenges. Laser etching a surface of the sapphire substrate can form light-extraction features that include structures formed in or on light-emitting surfaces of substrates. Light-extraction features may include repeating patterns of features with dimensions that, along with reduced substrate thicknesses, provide targeted emission profiles for flip-chip structures, such as Lambertian emission profiles. In some embodiments, laser ablation of the sapphire substrate can also be used to form trenches between active layer portions of an LED matrix to form pixels that reduce interference between the active layer portions. The trenches can further be filled with materials with light-altering properties to further refine the desired emission characteristics.

12 Claims, 15 Drawing Sheets

(51) Int. Cl.
*H10H 29/80* (2025.01)
*H10H 20/80* (2025.01)

(52) U.S. Cl.
CPC ........ *H10H 20/018* (2025.01); *H10H 20/019* (2025.01); *H10H 29/882* (2025.01); *H10H 20/0363* (2025.01); *H10H 20/882* (2025.01)

(56) References Cited

U.S. PATENT DOCUMENTS

| | | | | |
|---|---|---|---|---|
| 2013/0119424 | A1* | 5/2013 | Kang ................. | H10H 20/8583 257/98 |
| 2016/0163937 | A1 | 6/2016 | Inoue et al. | |
| 2019/0229238 | A1 | 7/2019 | Niwa et al. | |
| 2021/0336093 | A1 | 10/2021 | Stasiw et al. | |
| 2021/0408328 | A1 | 12/2021 | Andrews | |
| 2022/0271017 | A1 | 8/2022 | Edmond et al. | |

OTHER PUBLICATIONS

Invitation to Pay Additional Fees and Partial Search for International Patent Application No. PCT/US2024/013049, mailed Jul. 23, 2024, 10 pages.
International Search Report and Written Opinion for International Patent Application No. PCT/US2024/013049, mailed Sep. 13, 2024, 18 pages.
Notice of Allowance for Taiwanese Patent Application No. 113102867, mailed Jun. 20, 2025, 3 pages.
Notice of Reasons for Refusal for Japanese Patent Application No. 2025-544837, mailed Aug. 28, 2026, 8 pages.

* cited by examiner

LASER ETCHING FOR LIGHT-EMITTING DIODE DEVICES AND RELATED METHODS

FIELD OF THE DISCLOSURE

The present disclosure relates to solid-state lighting devices, and more particularly to laser etching for light-emitting diode (LED) devices and related methods.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have enabled a variety of new display applications and are being increasingly utilized for general illumination and automotive applications, often replacing incandescent and fluorescent light sources.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An LED chip typically includes an active region that may be fabricated, for example, from silicon carbide, gallium nitride, gallium phosphide, aluminum nitride, gallium arsenide-based materials, and/or from organic semiconductor materials. Photons generated by the active region are initiated in all directions.

Typically, it is desirable to operate LEDs at the highest light emission efficiency possible, which can be measured by the emission intensity in relation to the output power (e.g., in lumens per watt). A practical goal to enhance emission efficiency is to maximize extraction of light emitted by the active region in the direction of the desired transmission of light. Light extraction and external quantum efficiency of an LED can be limited by a number of factors, including internal reflection. According to the well-understood implications of Snell's law, photons reaching the surface (interface) between an LED surface and the surrounding environment are either refracted or internally reflected. If photons are internally reflected in a repeated manner, then such photons eventually are absorbed and never provide visible light that exits an LED.

LED packages, modules, and fixtures have been developed that may include multiple LED emitters that are arranged in close proximity to one another. In such applications, the LED emitters can be provided such that emissions corresponding to individual LED emitters are combined to produce desired light emissions. The emissions corresponding to individual LED emitters can be selectively generated in order to provide similar or different emission characteristics. There can be challenges in producing high quality light with desired emission characteristics when different LED emitters are provided in close proximity to one another. Additionally, conventional packaging of LED emitters may further provide spacing limitations between individual LED emitters.

The art continues to seek improved LEDs and solid-state lighting devices having desirable illumination characteristics capable of overcoming challenges associated with conventional lighting devices.

SUMMARY

The present disclosure relates to solid-state lighting devices, and more particularly to laser etching for light-emitting diode (LED) devices and related methods. LED devices that use sapphire substrates are difficult to etch using conventional techniques, but laser etching and ablation of sapphire substrates overcomes these challenges. Laser etching a surface of the sapphire substrate can form light-extraction features that include structures formed in or on light-emitting surfaces of substrates. Light-extraction features may include repeating patterns of features with dimensions that, along with reduced substrate thicknesses, provide targeted emission profiles for flip-chip structures, such as Lambertian emission profiles. In some embodiments, laser ablation of the sapphire substrate can also be used to form trenches between active layer portions of an LED matrix to form pixels that reduce interference between the active layer portions. The trenches can further be filled with materials with light-altering properties to further refine the desired emission characteristics.

In an embodiment, an LED chip includes a substrate comprising a first surface and a second surface that opposes the first surface, the substrate comprising a thickness that is less than or equal to 500 microns (μm). The LED chip also includes an active LED structure on the first surface of the substrate, the active LED structure being configured to generate light that passes through the substrate when electrically activated. The LED chip also includes a first plurality of light-extraction features according to a predefined pattern at the second surface of the substrate, each light-extraction feature of the first plurality of light-extraction features comprising a height and a width, and an average ratio of the height to the width for individual light-extraction features of the first plurality of light-extraction features is in a range from 0.3 to 1. In an embodiment, each light-extraction feature of the first plurality of light-extraction features comprises a second plurality of light extraction features that are smaller than the first plurality of light-extraction features. In an embodiment, a width of the first plurality of light extraction features can be between 1 μm-30 μm. In an embodiment, a width of the second plurality of light extraction features can be between 10 nm-500 nm. In an embodiment, a distribution of the second plurality of light-extraction features is random. In an embodiment, the active LED structure comprises group III-Nitride semiconductor materials and the substrate comprises sapphire. In an embodiment, the first plurality of light-extraction features and the second plurality of light-extraction features comprise a same material as the substrate. In an embodiment, the first plurality of light-extraction features are formed in an additional layer that is on the second surface of the substrate. In an embodiment, the additional layer comprises at least one of glass, silicon nitride, silicone dioxide, and silicone. In an embodiment, the predefined pattern comprises light-extraction features spread uniformly across the second surface of the substrate. In an embodiment, the predefined pattern comprises light-extraction features spread non-uniformly across the second surface of the substrate. In an embodiment, the predefined pattern comprises linear grooves across the second surface of the substrate. In an embodiment, the predefined pattern comprises linear grooves with non-uniform spacing between the linear grooves across the second surface of the substrate. In an embodiment, the predefined pattern comprises a first region of the second surface of the substrate with a first density of light-extraction features and a second region of the second surface of the substrate with a second density of light-extraction features different than the first density. In an embodiment, the substrate is 500 μm thick when the light emitted by the LED chip is between 220-320 nm. In an embodiment, the substrate is 150 μm thick when the light emitted by the LED chip is between 400-550 nm In another embodiment, a method includes providing a light-emitting diode (LED) wafer comprising a substrate with a first surface and a second surface that opposes the first surface and an active LED structure on the first surface of the substrate. The method also includes laser etching at a second surface of the substrate to form a first plurality of light-extraction features according to a predefined pattern. The method also includes separating a plurality of LED chips from the LED wafer, each LED chip of the plurality of LED chips comprising a portion of the active LED structure and a portion of the substrate with light-extraction features of the first plurality of light-extraction features. In an embodiment, the substrate is crystalline sapphire, and wherein in response to the laser etching, the first plurality of light-extraction features comprise one or more deposits of amorphous sapphire. In an embodiment, the method can also include etching the one or more deposits of amorphous sapphire, resulting in a second plurality of light-extraction features in each light-extraction feature of the first plurality of light-extraction features. In an embodiment, a width of the first plurality of light extraction features can be between 1 μm-10 μm and a width of the second plurality of light extraction features can be between 10 nm-500 nm. In an embodiment, the laser etching at the second surface of the substrate comprises laser etching an additional layer formed on the second surface of the substrate, the additional layer comprising at least one of glass, silicon nitride, silicone dioxide, and silicone.

In an embodiment, a method for fabricating a pixelated light emitting diode (LED) device includes forming an active LED structure on a first surface of a substrate, defining a plurality of streets through the active layer to form a plurality of active layer portions that form a plurality of pixels, and laser etching interpixel regions within the substrate along the streets to form trenches in the interpixel regions of the substrate, resulting in a pixel being at least partially optically isolated. In an embodiment, the laser etching comprises laser etching the first surface of the substrate, In an embodiment, the laser etching comprises laser etching a second surface of the substrate opposite the first surface. In an embodiment, the method includes forming one or more layers in the trenches with light-altering properties. In an embodiment, the light-altering properties can include reflective or absorptive properties. In an embodiment, the method includes fixing the pixelated LED lighting device to a printed circuit board substrate and laser etching the interpixel regions to completely remove the substrate in the interpixel regions. In an embodiment, the method includes laser etching at a second surface of the substrate, opposite the first surface, to form a first plurality of light-extraction features according to a predefined pattern. In an embodiment, the substrate is sapphire. In an embodiment, a focal point of a laser performing the laser etching is below a surface of the substrate. In an embodiment, the laser etching comprises repeatedly pulsing an ultrafast laser, where each pulse of the ultrafast laser is shorter than a nanosecond.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1B:
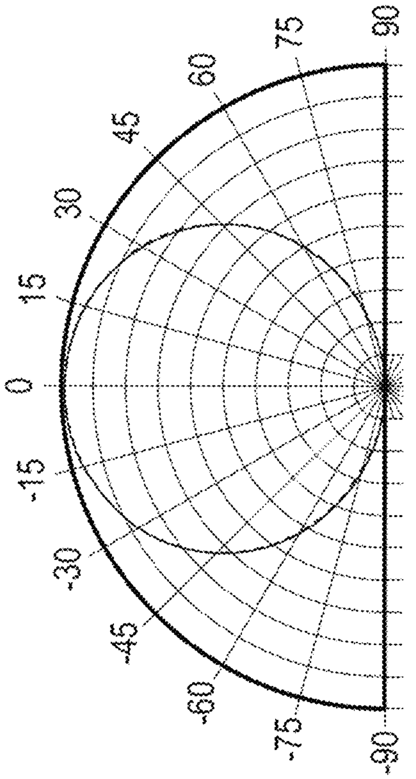
FIG. 1B is an exemplary Lambertian emission profile for an LED chip that is flip-chip mounted with a sapphire substrate serving as a light-emitting face according to aspects of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to solid-state lighting devices, and more particularly to laser etching for light-emitting diode (LED) devices and related methods. LED devices that use sapphire substrates are difficult to etch using conventional techniques, but laser etching and ablation of sapphire substrates overcomes these challenges. Laser etching a surface of the sapphire substrate can form light-extraction features that include structures formed in or on light-emitting surfaces of substrates. Light-extraction features may include repeating patterns of features with dimensions that, along with reduced substrate thicknesses, provide targeted emission profiles for flip-chip structures, such as Lambertian emission profiles. In some embodiments, laser ablation of the sapphire substrate can also be used to form trenches between active layer portions of an LED matrix to form pixels that reduce interference between the active layer portions. The trenches can further be filled with materials with light-altering properties to further refine the desired emission characteristics.

An LED chip typically comprises an active LED structure or region that may have many different semiconductor layers arranged in many different ways. The fabrication and operation of LEDs and their active structures are generally known in the art and are only briefly discussed herein. The layers of the active LED structure may be fabricated using known processes with a suitable process being metal organic chemical vapor deposition. The layers of the active LED structure typically comprise many different layers and generally comprise an active layer sandwiched between n-type and p-type oppositely doped epitaxial layers, all of which are formed successively on a growth substrate. It is understood that additional layers and elements may also be included in the active LED structure, including, but not limited to, buffer layers, nucleation layers, super lattice structures, un-doped layers, cladding layers, contact layers, and current-spreading layers and light extraction layers and elements. The active layer may comprise a single quantum well, a multiple quantum well, a double heterostructure, or super lattice structures.

The active LED structure may be fabricated from different material systems, with some material systems being Group III nitride-based material systems. Group III nitrides refer to those semiconductor compounds formed between nitrogen (N) and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), and related compounds.

Different embodiments of the active LED structure may emit different wavelengths of light depending on the composition of the active layer and n-type and p-type layers. In certain embodiments, the active LED structure may emit blue light with a peak wavelength range of approximately 430 nanometers (nm) to 480 nm. In other embodiments, the active LED structure may emit green light with a peak wavelength range of 500 nm to 570 nm. In other embodiments, the active LED structure may emit red light with a peak wavelength range of 600 nm to 650 nm. In certain embodiments, the active LED structure may emit light with a peak wavelength in any area of the visible spectrum, for example peak wavelengths primarily in a range from 400 nm to 700 nm.

In certain embodiments, the active LED structure may be configured to emit light that is outside the visible spectrum, including one or more portions of the ultraviolet (UV) spectrum, the infrared (IR) or near-IR spectrum. The UV spectrum is typically divided into three wavelength range categories denotated with letters A, B, and C. In this manner, UV-A light is typically defined as a peak wavelength range from 315 nm to 400 nm, UV-B is typically defined as a peak wavelength range from 280 nm to 315 nm, and UV-C is typically defined as a peak wavelength range from 100 nm to 280 nm. UV LEDs are of particular interest for use in applications related to the disinfection of microorganisms in air, water, and surfaces, among others. In other applications, UV LEDs may also be provided with one or more lumiphoric materials to provide LED packages with aggregated emissions having a broad spectrum and improved color quality for visible light applications. Near-IR and/or IR wavelengths for LED structures of the present disclosure may have wavelengths above 700 nm, such as in a range from 750 nm to 1100 nm, or more.

The LED chip may also be covered with one or more lumiphoric or other conversion materials, such as phosphors, such that at least some of the light from the LED chip is absorbed by the one or more phosphors and is converted to one or more different wavelength spectra according to the characteristic emission from the one or more phosphors. In some embodiments, the combination of the LED chip and the one or more phosphors emits a generally white combination of light. The one or more phosphors may include yellow (e.g., YAG:Ce), green (e.g., LuAg:Ce), and red (e.g., $Ca_{i-x-y}Sr_xEu_yAlSiN_3$) emitting phosphors, and combinations thereof. Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips. In some embodiments, one or more phosphors may include yellow phosphor (e.g., YAG:Ce), green phosphor (e.g., LuAg:Ce), and red phosphor (e.g., $Ca_{i-x-y}Sr_xEu_y$-$AlSiN_3$) and combinations thereof. One or more lumiphoric materials may be provided on one or more portions of an LED chip and/or a submount in various configurations.

Light emitted by the active layer or region of an LED chip may typically travel in a variety of directions. For targeted directional applications, internal mirrors or external reflective surfaces may be employed to redirect as much light as possible toward a desired emission direction. Internal mirrors may include single or multiple layers. Some multi-layer mirrors include a metal reflector layer and a dielectric reflector layer, wherein the dielectric reflector layer is arranged between the metal reflector layer and a plurality of semiconductor layers. A passivation layer is arranged between the metal reflector layer and first and second electrical contacts, wherein the first electrical contact is arranged in conductive electrical communication with a first semiconductor layer, and the second electrical contact is arranged in conductive electrical communication with a second semiconductor layer. For single or multi-layer mirrors including surfaces exhibiting less than 100% reflectivity, some light may be absorbed by the mirror. Additionally, light that is redirected through the active LED structure may be absorbed by other layers or elements within the LED chip.

As used herein, a layer or region of a light-emitting device may be considered to be "transparent" when at least 80% of emitted radiation that impinges on the layer or region emerges through the layer or region. Moreover, as used herein, a layer or region of an LED is considered to be "reflective" or embody a "mirror" or a "reflector" when at least 80% of the emitted radiation that impinges on the layer or region is reflected. In some embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (Ag) may be considered a reflective material (e.g., at least 80% reflective). In the case of UV LEDs, appropriate materials may be selected to provide a desired, and in some embodiments high, reflectivity and/or a desired, and in some embodiments low, absorption. In certain embodiments, a "light-transmissive" material may be configured to transmit at least 50% of emitted radiation of a desired wavelength.

The present disclosure may be useful for LED chips having a variety of geometries, including flip-chip geometries. Flip-chip structures for LED chips typically include anode and cathode connections that are made from a same side or face of the LED chip. The anode and cathode side is typically structured as a mounting face of the LED chip for flip-chip mounting to another surface, such as a printed circuit board. In this regard, the anode and cathode connections on the mounting face serve to mechanically bond and electrically couple the LED chip to the other surface. When flip-chip mounted, the opposing side or face of the LED chip corresponds with a light-emitting face that is oriented toward an intended emission direction. In certain embodiments, a growth substrate for the LED chip may form and/or be adjacent to the light-emitting face when flip-chip mounted. During chip fabrication, the active LED structure may be epitaxially grown on the growth substrate.

Growth substrates may typically include many materials, such as sapphire ($Al_2O_3$), SiC, aluminum nitride (AlN), and GaN. Sapphire is a common substrate for Group III nitrides and has certain advantages, including being lower cost, having established manufacturing processes, and having good light transmissive optical properties. However, sapphire is also known to exhibit guided modes for light propagation that result in some lateral waveguiding within the substrate. In this manner, light emission patterns for sapphire-based flip-chips may not be entirely Lambertian in nature. Rather, increased intensities of light may exit toward perimeter edges of such LED chips.

Figure 1A:
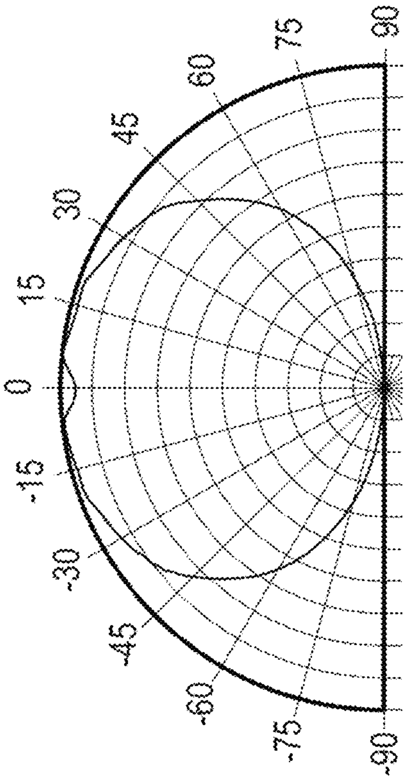
FIG. 1A is an exemplary non-Lambertian emission profile for a light-emitting diode (LED) chip that is flip-chip mounted with a sapphire substrate serving as a light-emitting face.

FIG. 1A is an exemplary emission profile for an LED chip that is flip-chip mounted with a sapphire substrate serving as a light-emitting face. In FIG. 1A, the emission angles are plotted with angles as measured from a direction normal to the light-emitting face of the LED chip. As such, an angle of 0° represents the center direction that is perpendicular from the light-emitting face. Light generated in the active LED structure may pass through the sapphire substrate before exiting the chip and contributing to the emission profile. As illustrated in FIG. 1A, lateral waveguiding within the sapphire substrate may cause a dip in emission intensity an angle of 0°. While such an emission profile is acceptable for many LED applications, certain directional applications, including torch, beam, and stage-lighting, among others, may prefer more Lambertian emission profiles. Conventional LED chip structures, such as those where active LED structures are flipped and mounted to carrier substrates with growth substrates removed, have been developed that address the above-described deficiencies of sapphire substrates. However, such techniques typically involve more complex fabrication with increased associated costs.

According to principles of the present disclosure, sapphire substrate structures are disclosed for flip-chip LEDs that provide more Lambertian emission profiles. Such structures included certain substrate thicknesses in combination with various light extraction features provided along the light-emitting face. In this manner, aspects of the present disclosure may provide exemplary emission profiles for flip-chip LEDs with sapphire substrates as illustrated in FIG. 1B. In this regard, increased light emissions are provided at or near 0° angles while decreased light emissions are provided at wider angles, such as +/−30° or more. While embodiments of the present disclosure are described in the context of sapphire substrates, the principles disclosed are equally applicable to other growth substrates that may exhibit lateral waveguiding, including AlN and SiC substrates.

Figure 2:
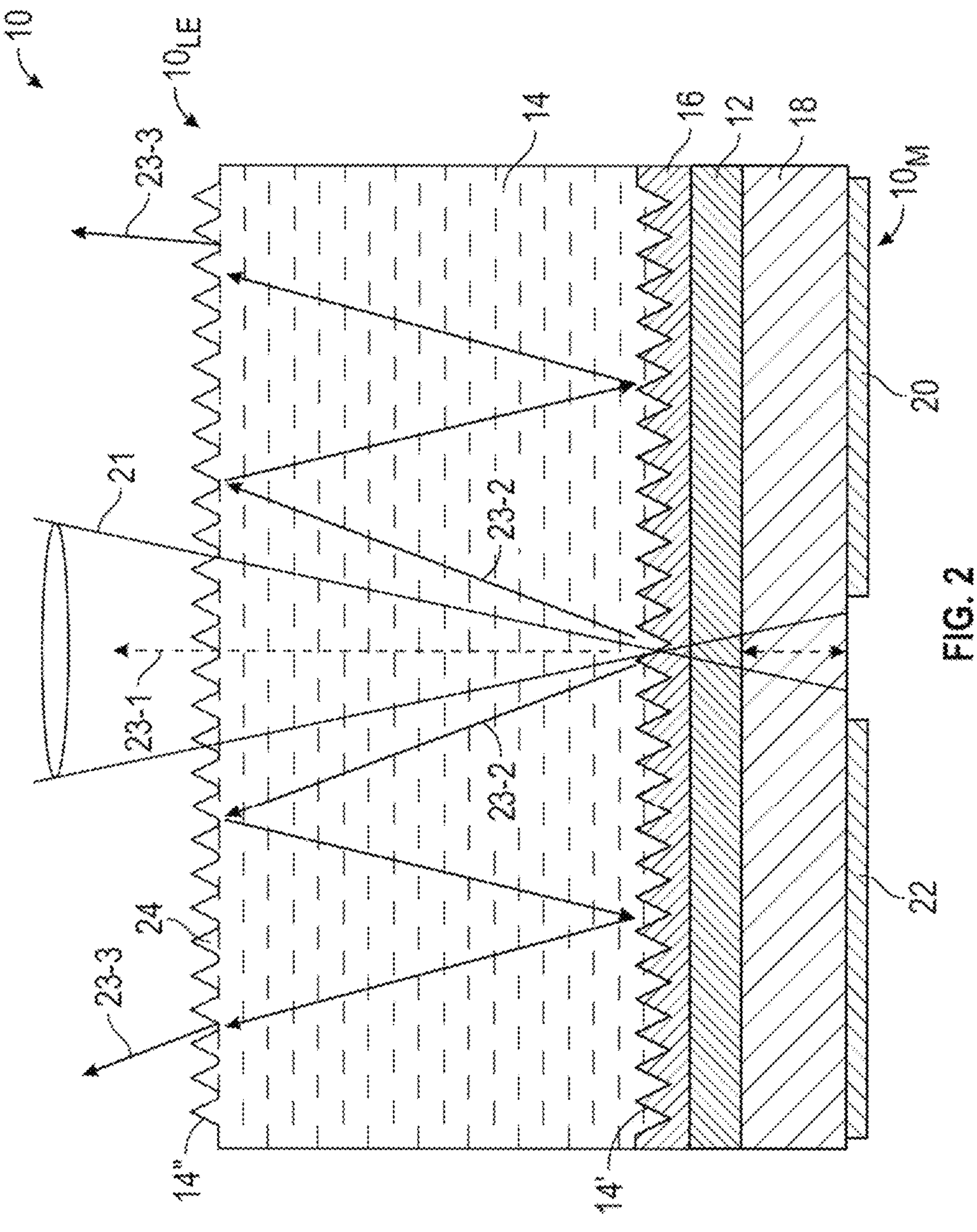
FIG. 2 is a generalized cross-sectional view of an LED chip with a flip-chip orientation and light-extraction features according to aspects of the present disclosure.

FIG. 2 is a generalized cross-sectional view of an LED chip 10 with a flip-chip orientation according to aspects of the present disclosure. The LED chip 10 includes an active LED structure 12 that is formed on a substrate 14, or growth substrate. In certain embodiments, one or more buffer layers and/or undoped layers 16 may be provided between the substrate 14 and the active LED structure 12. The substrate 14 may embody a patterned substrate such that a first surface 14' of the substrate 14 closest to the active LED structure 12 is patterned. The first surface 14' may include multiple recessed and/or raised features that form an interface that enhances light-extraction between the active LED structure 12 and the substrate 14. A number of metallization, dielectric, and/or reflective layers, generally indicated with label 18 in FIG. 2, may be provided on a side of the active LED structure 12 that is opposite the substrate 14. An anode contact 20 and a cathode contact 22 complete the LED chip 10. As illustrated, the anode/cathode side of the LED chip 10 forms a mounting face $\mathbf{10}_M$ and an opposing face of the LED chip 10 forms a primary light-emitting face $\mathbf{10}_{LE}$. As illustrated, the primary light-emitting face $\mathbf{10}_{LE}$ corresponds with a second surface 14" of the substrate 14 that is opposite the first surface 14'. As used herein, the primary light-emitting face $\mathbf{10}_{LE}$ forms the intended light-exiting surface for a majority of light generated by the active LED structure 12.

When the LED chip 10 is electrically activated, light generated within the active LED structure 12 may enter the substrate 14 and follow any number of light-propagation paths. An escape cone 21 illustrates angles of light 23-1 at or near normal to the second surface 14" that may escape the substrate 14 along a desired emission direction. Light 23-2 that reaches the second surface 14" with angles outside the escape cone 21 may be laterally re-directed within the substrate 14, thereby forming lateral waveguiding. In certain embodiments, the second surface 14" of the substrate 14 is formed with light-extraction features 24 that form non-planar surfaces that increase the probability the laterally propagating light 23-2 may escape the second surface 14" as light 23-3 along a desired emission direction. The light-extraction features 24 may embody raised protrusions from the substrate 14, such as an array of cone-shaped protrusions. In certain embodiments, the light-extraction features 24 are formed in the substrate 14 by a subtractive process, such as etching. The light-extraction features 24 may form a repeating pattern across one or more portions of the substrate 14. In some embodiments, the light-extraction features 24 can be arrayed across a surface of the substrate 14 in a variety of predefined patterns, such as in lines, or other shapes, or be arranged with different densities in different regions of the surface of the substrates 14 depending on the desired light emission characteristics. In certain embodiments, the light-extraction features 24 form an array of cone shapes in the second surface 14". Without the light-extraction features 24, the laterally propagating light 23-2 may continue to non-Lambertian light emissions as illustrated by FIG. 1A. As will be described in greater detail below, dimensions of the light-extraction features 24 along with a thickness of the substrate 14 are disclosed that provide light emission patterns similar to FIG. 1B.

In an embodiment, the light-extraction features 24 can be formed by ultrafast laser etching where ultrashort pulses of sub-bandgap laser light can be used to induce nonlinear photoionization when focused tightly within a substrate material and/or a dielectric material. In certain embodiments, such laser etching involves providing a laser focal point beneath a material surface and forming subsurface damage regions. The laser parameters may be configured to promote propagation of the subsurface damage regions to the material surface to form the light-extraction features 24. Ultrashort pulses in the context of ultrafast lasers means that the pulses are on the order of femtosecond to picosecond long pulses, or pulses that are less than a nanosecond. The laser modification can manifest itself in several ways, including a local change to the material's refractive index and/or an increase in the material's chemical etching rate. Modifying a material in this way is commonly referred to as femtosecond direct laser writing (fs-DLW) or ultrafast laser inscription (ULI). Since the material modification is confined to the laser focal volume, ULI can be performed deep within a transparent substrate, with a resolution primarily determined by the pulse energy and the size and shape of the laser focus. Translating the material through the laser focus in three dimensions therefore allows for arbitrarily shaped channels, planes, or volumes to be inscribed.

The increase in the chemical etching rate is helpful due to the nature of the substrates being etched. For example, sapphire material as a substrate in LED chip has a number of advantages and benefits including allowing for higher powered, higher contrast LED matrixes with cheaper costs and higher brightness as compared to SiC-based substrates. Sapphire substrates however are difficult to etch or otherwise texture as the sapphire material is hard and chemically inert compared to SiC substrates. The cost and difficulty in etching sapphire substrates is much higher therefore than SiC substrates.

By using ultrafast laser etching to etch or otherwise texture the sapphire substrate, the crystalline sapphire can be textured, and/or removed locally, leaving behind deposits of amorphous sapphire that have an increased susceptibility to chemical etchants, enabling the amorphous sapphire deposits to be more easily removed after the ultrafast laser etching is performed. Between the ultrafast etching removing relatively large portions of crystalline sapphire, and the hyper-local modifications, the ultrafast laser etching and subsequent chemical etching can result in larger scale light-extraction features (e.g., 24) with widths between 1 μm-10 μm and smaller scale light-extraction features (e.g., 60 in FIG. 5) with widths between 10 nm and 500 nm.

Figure 3:
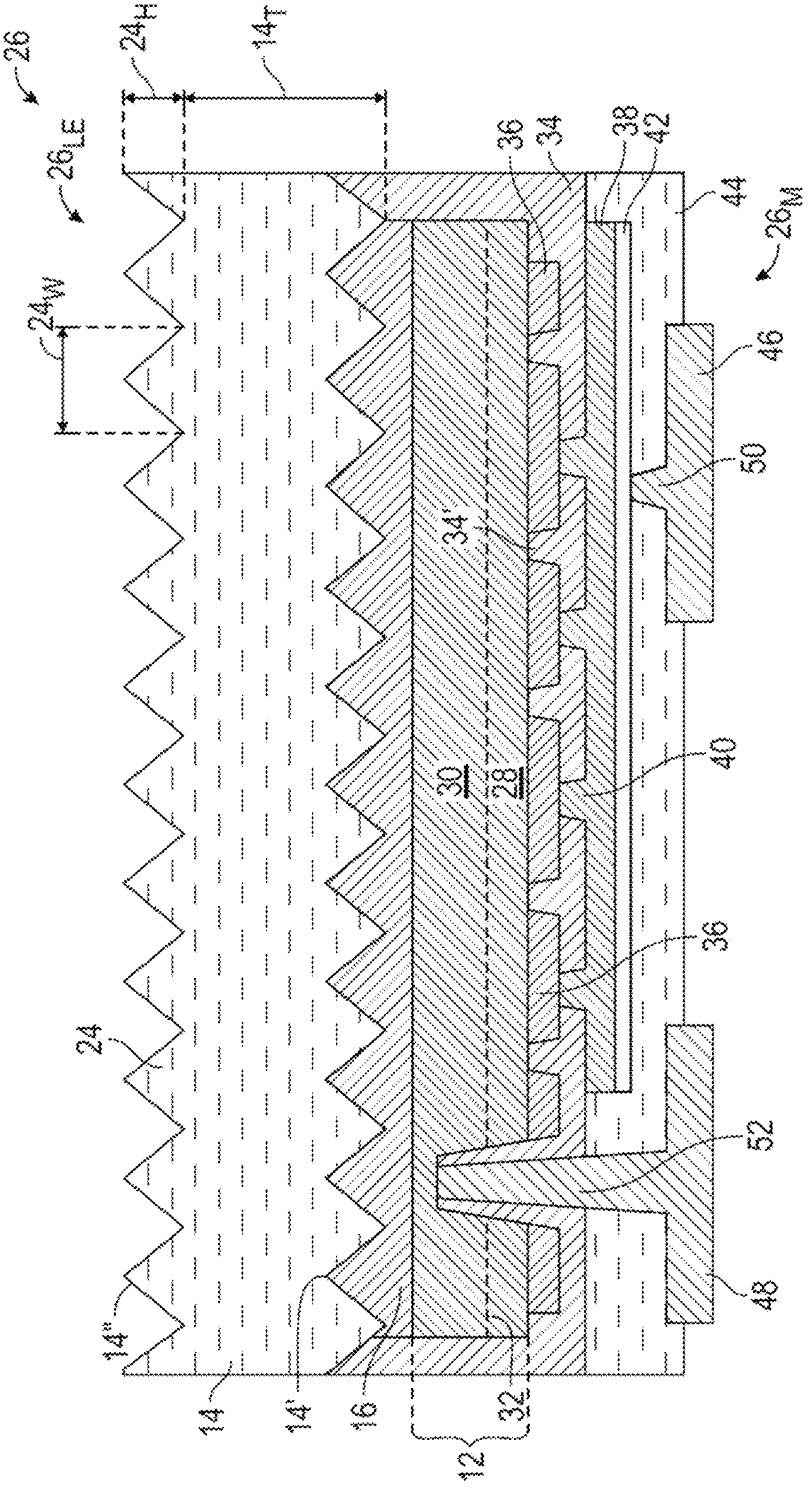
FIG. 3 is a cross-sectional view of a representative LED chip arranged with a flip-chip orientation and light-extraction features according to principles of the present disclosure in a similar manner to FIG. 2.

FIG. 3 is a cross-sectional view of a representative LED chip 26 arranged in a flip-chip configuration according to principles of the present disclosure in a similar manner to FIG. 2. As illustrated, the active LED structure 12 generally comprises a p-type layer 28, an n-type layer 30, and an active layer 32 formed on the substrate 14. In certain embodiments, one or more buffer layers and/or undoped layers 16 may be provided between the substrate 14 and the active LED structure 12. The substrate 14 may embody a patterned substrate such that the first surface 14' of the substrate 14 closest to the active LED structure 12 is patterned as described for FIG. 2. In certain embodiments, the n-type layer 30 is between the active layer 32 and the substrate 14. In other embodiments, the doping order may be reversed. The substrate 14 may comprise many different materials such as sapphire or AlN or SiC, among others, and can have one or more surfaces that are shaped, textured, or patterned to enhance light extraction. In certain embodiments, the substrate 14 is light transmissive (preferably transparent) to wavelengths of light generated by the active layer 32. For example, the substrate 14 may comprise a material that transmits at least 80%, or at least 90%, of light generated by the active LED structure 12. In certain embodiments, the active LED structure 12 comprises group III-Nitride semiconductor materials, or (Al, In, Ga)N materials, and the substrate 14 comprises sapphire.

The LED chip 26 may further include a first reflective layer 34 that is provided on portions of the p-type layer 28 with a current spreading layer 36 therebetween. The first reflective layer 34 may comprise many different materials and preferably comprises a material that presents an index of refraction step with the material of the active LED structure 12 to promote total internal reflection (TIR) of light generated from the active LED structure 12. Light that experiences TIR is redirected without experiencing absorption or loss and can thereby contribute to useful or desired LED chip emission. In certain embodiments, the first reflective layer 34 comprises a material with an index of refraction lower than the index of refraction of the active LED structure 12 material. The first reflective layer 34 may comprise many different materials, with some having an index of refraction less than 2.3, while others can have an index of refraction less than 2.15, less than 2.0, and less than 1.5. In some embodiments, the first reflective layer 34 comprises a dielectric material, with some embodiments comprising silicon dioxide ($SiO_2$) and/or silicon nitride (SiN). It is understood that many dielectric materials can be used such as SiN, SiNx, $Si_3N_4$, Si, germanium (Ge), $SiO_2$, SiOx, titanium dioxide ($TiO_2$), tantalum pentoxide ($Ta_2O_5$), indium tin oxide (ITO), magnesium oxide (MgOx), zinc oxide (ZnO), and combinations thereof. In certain embodiments, the first reflective layer 34 may include multiple alternating layers of different dielectric materials, e.g., alternating layers of $SiO_2$ and SiN that symmetrically repeat or are asymmetrically arranged. Some Group III nitride materials such as GaN can have an index of refraction of approximately 2.4, $SiO_2$ can have an index of refraction of approximately 1.48, and SiN can have an index of refraction of approximately 1.9. Embodiments with an active LED structure 12 comprising GaN and the first reflective layer 34 comprising $SiO_2$ can have a sufficient index of refraction step between the two to allow for efficient TIR of light. The first reflective layer 34 can have different thicknesses depending on the type of materials used, with some embodiments having a thickness of at least 0.2 microns (μm). In some of these embodiments, the first reflective layer 34 can have a thickness in the range of 0.2 μm to 0.7 μm, while in some of these embodiments the thickness can be approximately 0.5 μm. Portions of the first reflective layer 34 may extend along mesa sidewalls of the active LED structure 12.

The current spreading layer 36 may embody a layer of conductive material, for example a transparent conductive oxide such as ITO or a metal such as platinum (Pt), although other materials may be used. In certain embodiments, the current spreading layer 36 may continuously cover the p-type layer 28. In other embodiments and as illustrated in FIG. 3, the current spreading layer 36 may be formed with a number of openings or even discontinuous regions that allow portions 34' of the first reflective layer 34 to extend through the current spreading layer 36 and contact the p-type layer 28. In this manner, interfaces formed between the p-type layer 28 and the first reflective layer 34 that do not include the current spreading layer 36 may exhibit increased reflectivity to light generated by the active LED structure 12. Even though the current spreading layer 36 may not continuously cover the p-type layer 28, the openings or discontinuous regions of the current spreading layer 36 may have small enough lateral dimensions to still suitably spread current along the p-type layer 28.

The LED chip 26 may further include a second reflective layer 38 that is on the first reflective layer 34 such that the first reflective layer 34 is arranged between the active LED structure 12 and the second reflective layer 38. The second reflective layer 38 may include a metal layer that is configured to reflect any light from the active LED structure 12 that may pass through the first reflective layer 34. The second reflective layer 38 can comprise many different materials such as Ag, gold (Au), Al, or combinations thereof. As illustrated, the second reflective layer 38 may include one or more reflective layer interconnects 40 that provide electrically conductive paths through the first reflective layer 34 to the current spreading layer 36. In certain embodiments, the reflective layer interconnects 40 comprise reflective layer vias. Accordingly, the first reflective layer 34, the second reflective layer 38, and the reflective layer interconnects 40 form a reflective structure of the LED chip 26. In some embodiments, the reflective layer interconnects 40 comprise the same material as the second reflective layer 38 and are formed at the same time as the second reflective layer 38. In other embodiments, the reflective layer interconnects 40 may comprise a different material than the second reflective layer 38. The LED chip 26 may also comprise a barrier layer 42 on a side of the second reflective layer 38 opposite the first reflective layer 34 to prevent migration of the second reflective layer 38 material, such as Ag, to other layers. Preventing this migration helps the LED chip 26 maintain efficient operation through its lifetime. The barrier layer 42 may comprise an electrically conductive material, with suitable materials including but not limited to sputtered Ti/Pt followed by evaporated Au bulk material or sputtered Ti/Ni followed by an evaporated Ti/Au bulk material. A passivation layer 44 is included on the barrier layer 42 as well as any portions of the second reflective layer 38 that may be uncovered by the barrier layer 42. The passivation layer 44 may further be arranged on portions of the first reflective layer 34 that are uncovered by the second reflective layer 38. The passivation layer 44 protects and provides electrical insulation for the LED chip 26 and can comprise many different materials, such as a dielectric material. In certain embodiments, the passivation layer 44 is a single layer, and in other embodiments, the passivation layer 44 comprises a plurality of layers. A suitable material for the passivation layer 44 includes but is not limited to SiN, SiNx, and/or $Si_3N_4$. In certain embodiments, the first reflective layer 34 comprises $SiO_2$ and the passivation layer 44 comprises SiN, SiNx, or $Si_3N_4$. In other embodiments, the first reflective layer 34 and at least a portion of the passivation layer 44 may each comprise $SiO_2$.

In FIG. 3, the LED chip 26 comprises a p-contact 46 and an n-contact 48 that are arranged on the passivation layer 44 and are configured to provide electrical connections with the active LED structure 12. The p-contact 46, which may also be referred to as an anode contact, may comprise one or more p-contact interconnects 50 that extend through the passivation layer 44 to the barrier layer 42 or the second reflective layer 38 to provide an electrical path to the p-type layer 28. In certain embodiments, the one or more p-contact interconnects 50 comprise one or more p-contact vias. The n-contact 48, which may also be referred to as a cathode contact, may comprise one or more n-contact interconnects 52 that extend through the passivation layer 44, the barrier layer 42, the first and second reflective layers 34, 38, the p-type layer 28, and the active layer 32 to provide an electrical path to the n-type layer 30. In certain embodiments, the one or more n-contact interconnects 52 comprise one or more n-contact vias. In operation, a signal applied across the p-contact 46 and the n-contact 48 is conducted to the p-type layer 28 and the n-type layer 30, causing the LED chip 26 to emit light from the active layer 32. The p-contact 46 and the n-contact 48 can comprise many different materials such as Au, copper (Cu), nickel (Ni), In, Al, Ag, tin (Sn), Pt, or combinations thereof. In still other embodiments, the p-contact 46 and the n-contact 48 can comprise conducting oxides and transparent conducting oxides such as ITO, nickel oxide (NiO), ZnO, cadmium tin oxide, indium oxide, tin oxide, magnesium oxide, $ZnGa_2O_4$, $ZnO_2$/Sb, $Ga_2O_3$/Sn, $AgInO_2$/Sn, $In_2O_3$/Zn, $CuAlO_2$, LaCuOS, $CuGaO_2$, and $SrCu_2O_2$. The choice of material used can depend on the location of the contacts and on the desired electrical characteristics, such as transparency, junction resistivity, and sheet resistance. As described above, the LED chip 26 is arranged for flip-chip mounting and the p-contact 46 and n-contact 48 are configured to be mounted or bonded to a surface, such as a printed circuit board. As such, the p-contact 46 and n-contact 48 are arranged on a mounting surface $\mathbf{26}_M$ of the LED chip 26, and the second surface 14" of the substrate 14 forms a light-emitting face $\mathbf{26}_{LE}$ of the LED chip 26.

In FIG. 3, a thickness $\mathbf{14}_T$ of the substrate 14 along with heights $\mathbf{24}_H$ and widths $\mathbf{24}_W$ of the light-extraction features 24 are provided that reduce lateral waveguiding and provide light emission patterns similar to FIG. 1B. For illustrative purposes, relative dimensions of the light-extraction features 24 may be exaggerated in FIG. 3. According to aspects of the present disclosure, the thickness $\mathbf{14}_T$ of the substrate 14 may be less than or equal to 500 μm or less, or 150 μm or less, or less than or equal to 75 μm, or less than or equal to 60 μm, or less than or equal to 50 μm, or less than or equal to 25 μm, or less than or equal to 10 μm, or ranges defined by any of the above specified values with 0.5 μm as a lower boundary. In some embodiments, depending on the wavelength of the light emitted, thickness values above 100 μm may exhibit undesirable levels of lateral waveguiding, particularly for directional lighting applications. In other embodiments, substrate 14 may be 500 μm thick when the light emitted is in the UVC/UVB range (e.g., 220-320 nm). In other embodiments, the substrate 14 may be 150 μm thick when the light emitted is in the 400 to 550 nm wavelength range. As used in this application, "light" includes the emissions of the LED chip in the UVC/UVB range even though it may be out of visible range to the human eye. According to further aspects of the present disclosure, heights $\mathbf{24}_H$ and widths $\mathbf{24}_W$ of the light-extraction features 24 may be provided that are greater than about 0.5 μm, or in a range from 0.5 μm to 10 μm, among other ranges. In certain embodiments, the heights $\mathbf{24}_H$ and/or widths $\mathbf{24}_W$ of the light-extraction features 24 may be larger, such as up to about 100 μm, or even a same or similar value as a thickness of the substrate 14. It has also been found that regardless of actual dimensions, average height $\mathbf{24}_H$ to width $\mathbf{24}_W$ ratios (i.e., height $\mathbf{24}_H$ divided by width $\mathbf{24}_W$) for individual light-extraction features 24 across the substrate 14 provided in a range from 0.3 to 1, or in a range from 0.3 to 0.7, or in a range from 0.3 to 0.6 may provide improved Lambertian emission patterns across all of the above-specified thickness $\mathbf{14}_T$ values.

Figure 4:
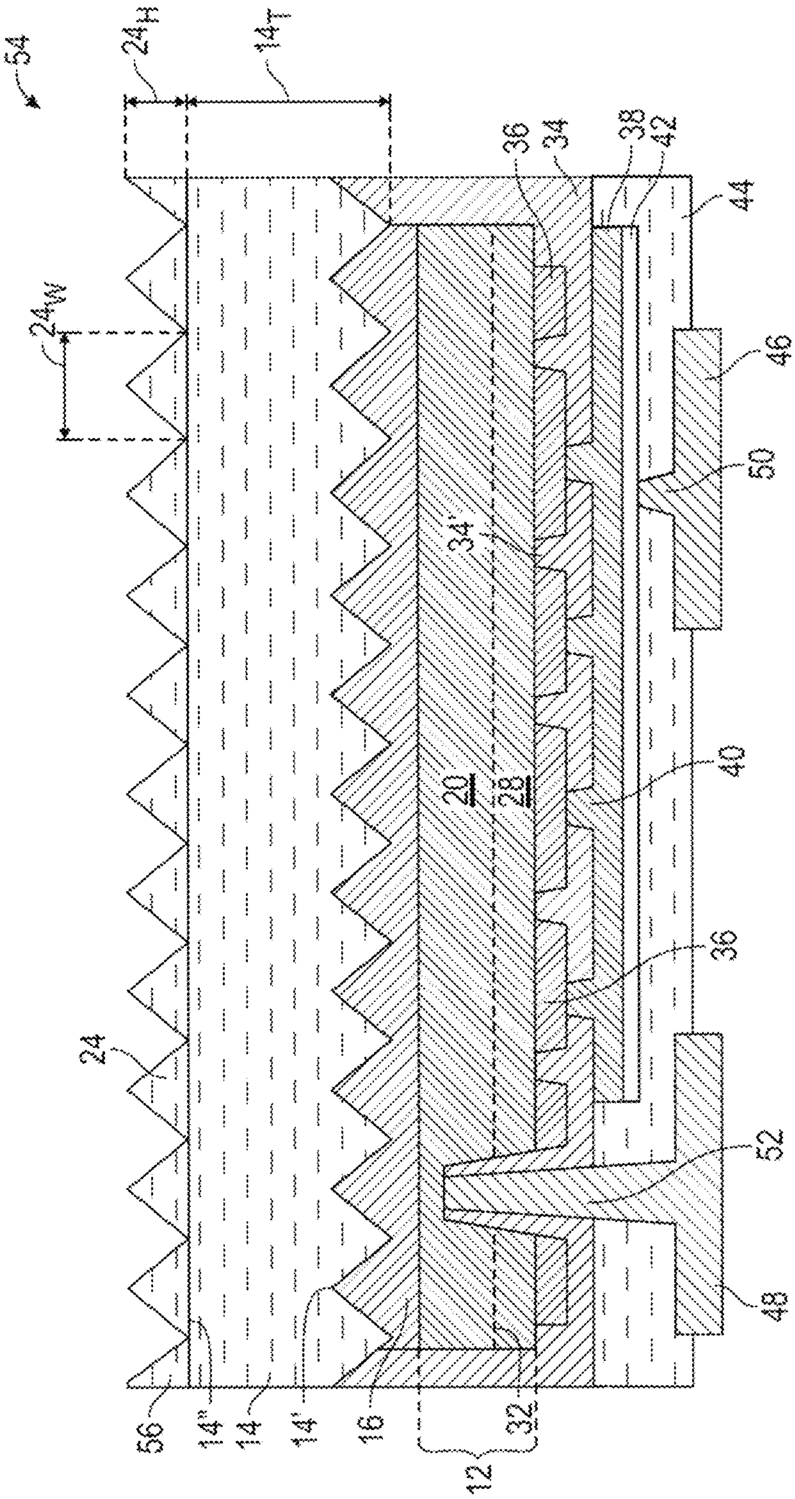
FIG. 4 is a cross-sectional view of an LED chip that is similar to the LED chip of FIG. 3, except light-extraction features are formed in an additional layer on the second surface of the substrate.

FIG. 4 is a cross-sectional view of an LED chip 54 that is similar to the LED chip 26 of FIG. 3, except the light-extraction features 24 are formed in an additional layer 56 on the second surface 14" of the substrate 14. Rather than forming the light-extraction features 24 directly into portions of the substrate 14 as illustrated in FIG. 3, the light-extraction features 24 of FIG. 4 are formed in the additional layer 56. In certain embodiments, the additional layer 56 may comprise a material that is light-transmissive and/or light-transparent to wavelengths of light generated by the active layer 32. For example, the additional layer 56 may comprise a material that transmits at least 80%, or at least 90% of light from the active LED structure 12. Exemplary materials for the additional layer 56 include glass, silicon nitride, $SiO_2$, and silicone. The light-extraction features 24 may be pre-formed in the additional layer 56 before it is applied to the substrate 14. In other embodiments, the light-extraction features 24 may be formed in the additional layer 56 after it is added to the substrate 14. In certain embodiments, the heights $\mathbf{24}_H$ and widths $\mathbf{24}_W$ of the light-extraction features 24 in the additional layer 56 may be the same as described above for FIG. 3.

Figure 5:
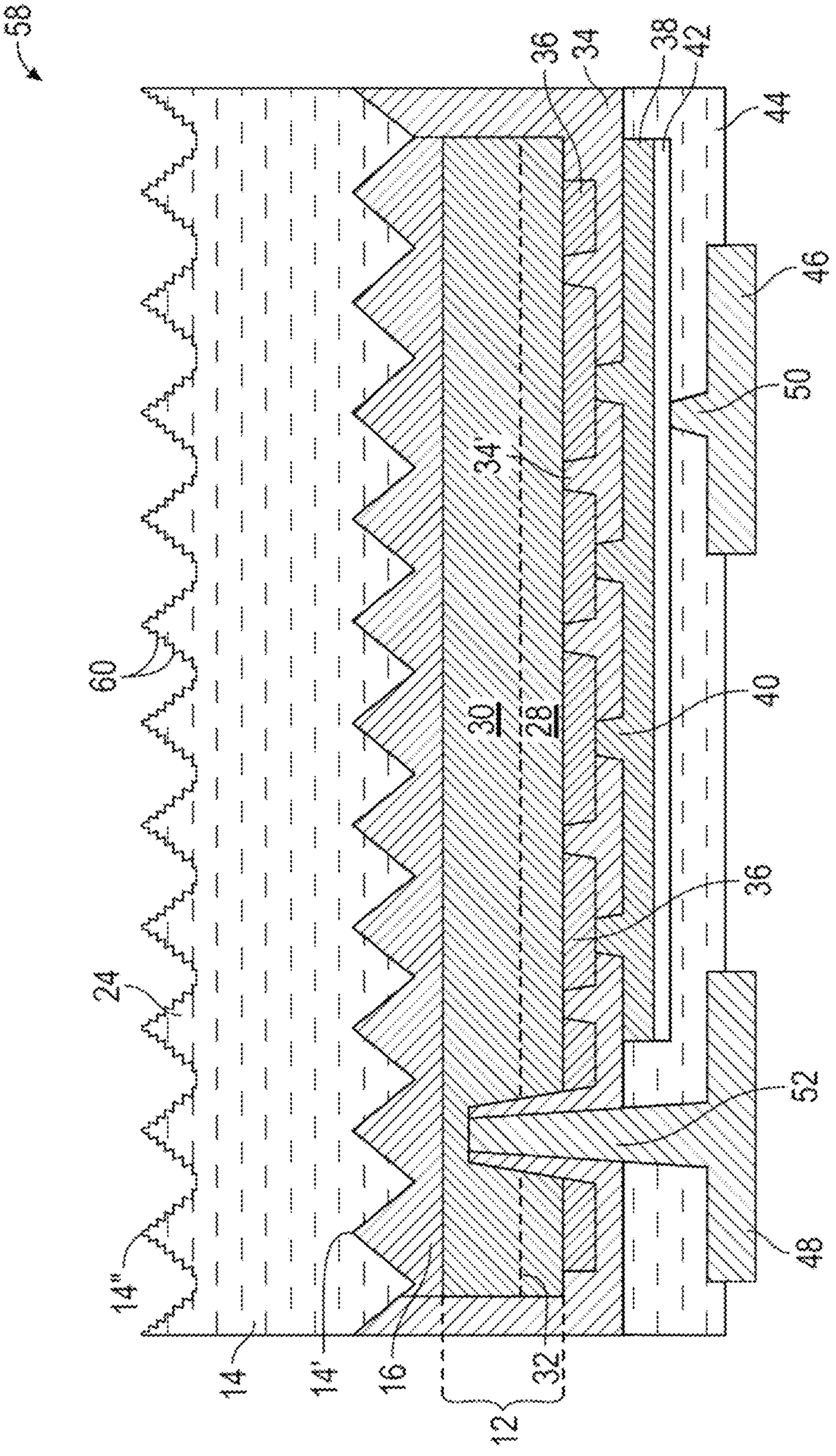
FIG. 5 is a cross-sectional view of an LED chip that is similar to the LED chip of FIG. 3, except surfaces of the light-extraction features may include additional light-extraction features formed thereon.

FIG. 5 is a cross-sectional view of an LED chip 58 that is similar to the LED chip 26 of FIG. 3, except surfaces of the light-extraction features 24 may include additional light-extraction features 60 formed thereon. In this regard, the additional light-extraction features 60 may have smaller dimensions than the larger light-extraction features 24 and further increase the likelihood of light escaping the substrate 14. In certain embodiments, the additional light-extraction features 60 may have heights and/or widths that are less than the light-extraction features 24, such as less than 0.5 times, or less than 0.3 times, or less than 0.1 times the heights $\mathbf{24}_H$ and/or widths $\mathbf{24}_W$ of the light-extraction features 24. While the light-extraction features 24 may be formed in a repeating pattern across the substrate 14, the additional light-extraction features 60 may be formed in an irregular arrangement, such as random texturing along sidewalls or side surfaces of the light-extraction features 24. In certain embodiments, the additional light-extraction features 60 may be formed simultaneously with the larger light-extraction features 24. For example, the light-extraction features 24 may be formed by the ultrafast laser etching process described above and operating parameters of the laser ablation may be adjusted to form the irregularities of the additional light-extraction features 60. In other embodiments, the additional light-extraction features 60 may be formed in a subsequent step, such as chemical or plasma etching through a mask that is applied to the larger light-extraction features 24. In a specific example, a solution of nanoparticles may be spin coated over the light-extraction features 24 such that the nanoparticles form various nano etch masks that are distributed along the light-extraction features 24. The additional light-extraction features 60 may then be formed by an etching process, such as plasma etching, through the nano etch masks. After etching, the nanoparticles may be removed.

Figure 6:
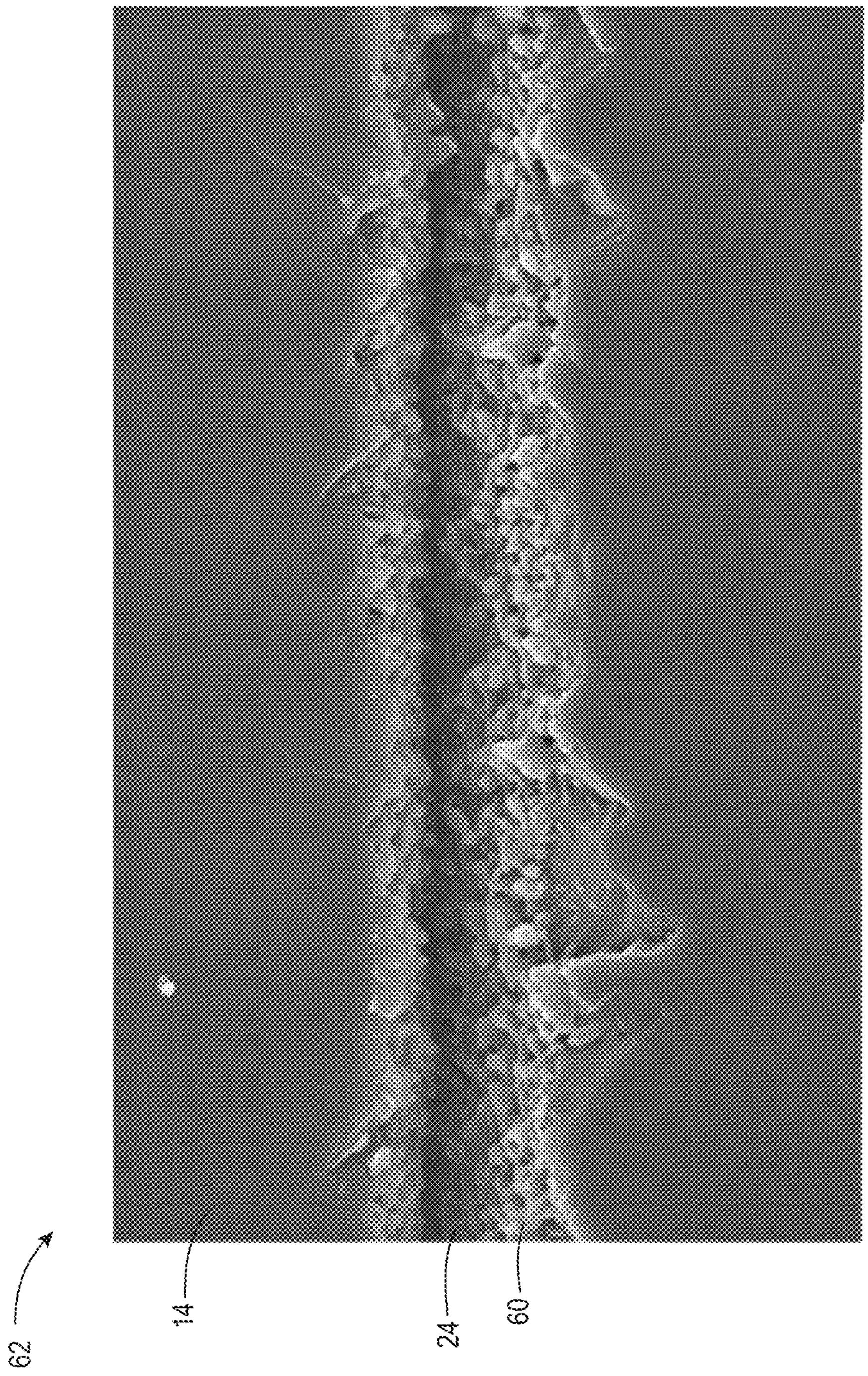
FIG. 6 is a focused ion beam (FIB) image of a portion of an LED chip that is similar to the LED chip of FIG. 5.

FIG. 6 is a focused ion beam (FIB) image of a portion of an LED chip 62 that is similar to the LED chip 58 of FIG. 5. The FIB image depicts a light-extraction feature 24 formed as a trench on the substrate 14. In other embodiments, the light-extraction feature 24 can be in the form of other shapes or sizes. The light-extraction feature 24 can include a second plurality of smaller light-extraction features 60 that are formed as a result of the hyper local modifications caused by the ultrafast laser etching and subsequent chemical etching to remove the deposits left behind by the ultrafast laser etching. The second plurality of light-extraction features 60 can be relatively randomly sized and distributed. In other embodiments, laser parameters can be set to result in smaller light-extraction features with predefined ranges of sizes and predefined distributions on the light-extraction features 24.

Figure 7A:
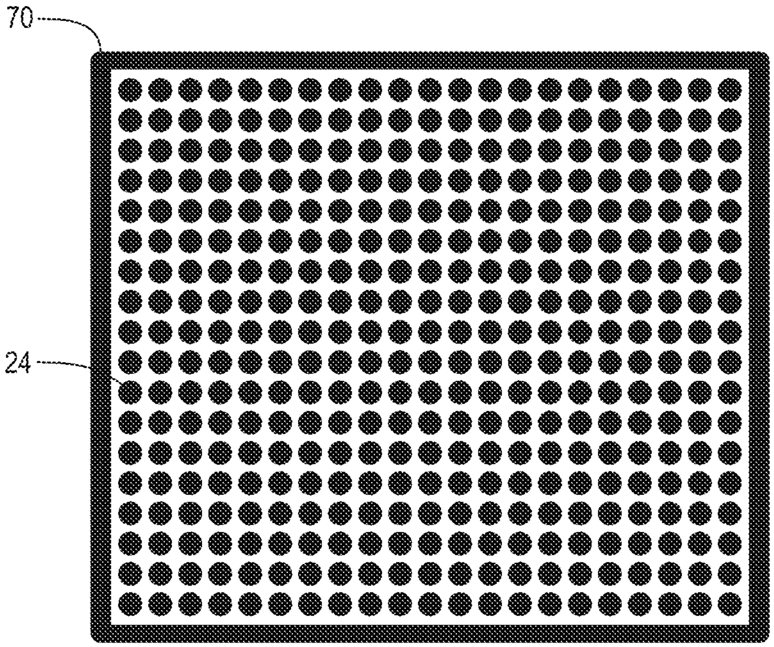
FIGS. 7A and 7B depict exemplary light-extraction feature distributions on LED chips according to aspects of the present disclosure.
Figure 7B:
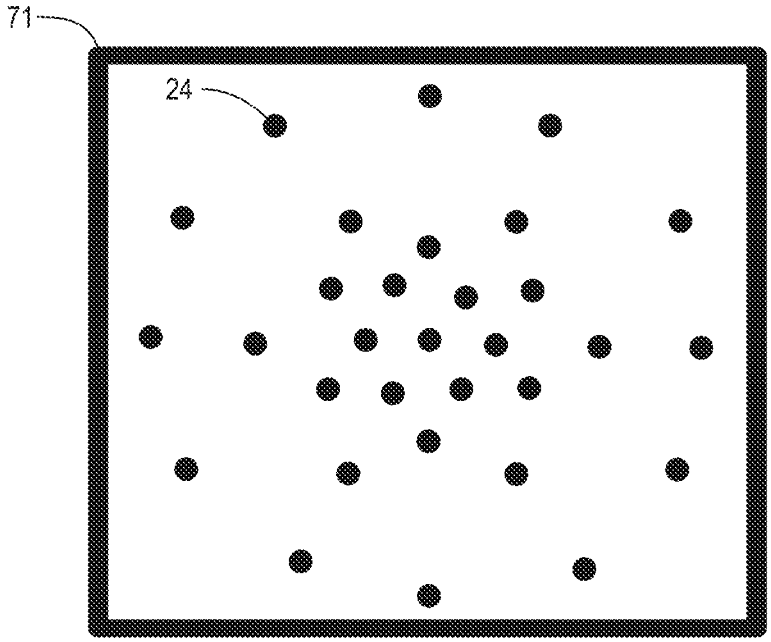

FIGS. 7A and 7B illustrate exemplary light-extraction feature distributions on LED chips 70 and 71 according to aspects of the present disclosure. Due to the ability to easily adjust the focal location and/or position of the LED chip with respect to the laser, the LED chips 70 and 71 can be formed with a plurality of light-extraction features arranged in a variety of predefined patterns. LED chips 70 and 71 can be similar to LED chip 62 and 58 and etc.

In FIG. 7A, the plurality of light-extraction features 24 can be formed on the substrate surface of the LED chip 70 in a regular, evenly spaced pattern. The number and/or density of the plurality of light-extraction features 24 can vary based on the size of the light-extraction features 24, the size of the LED chip 70, and/or the desired light emission characteristics of the LED chip 70.

In FIG. 7B, the plurality light-extraction features 24 formed on LED chip 71 can have a varying density across different regions of the LED chip 71. For example, as shown in FIG. 7B, the light-extraction features 24 can be more densely distributed in a central region of the surface of the LED chip 71, while being lightly distributed in less central regions of the surface of the LED chip 71. The density gradient can alter the emission brightness, contrast, or light interference cause by the LED chip 71, and thus the distribution can be selected based on the desired emission characteristics of the LED chip 71.

Figure 7C:
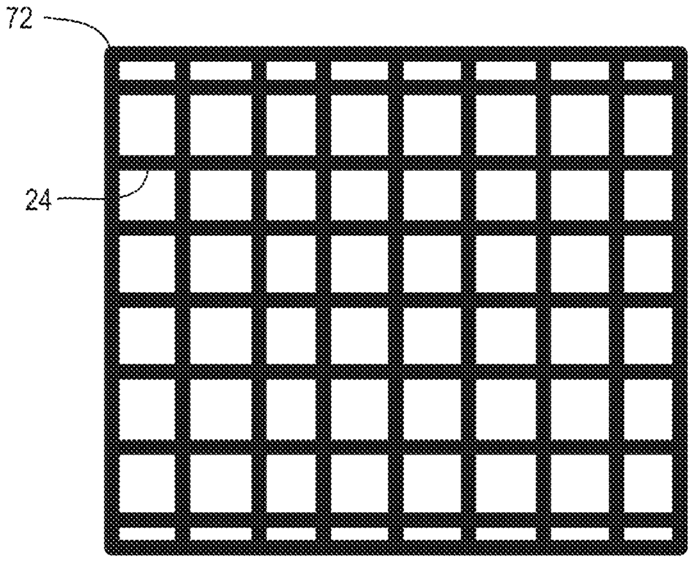
FIGS. 7C and 7D depict exemplary light-extraction features in the form of grooves on LED chips according to aspects of the present disclosure.
Figure 7D:
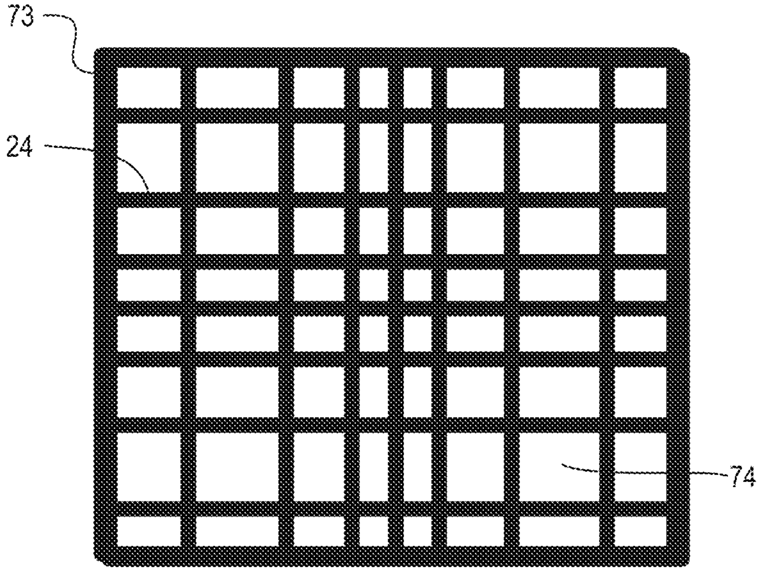

FIGS. 7C and 7D illustrate exemplary light-extraction features in the form of grooves on LED chips 72 and 73 according to aspects of the present disclosure. Similar to the examples in FIGS. 7A and 7B, the light-extraction features 24 can have different distributions across the top of LED chips 72 and 73, except that in FIGS. 7C and 7D, the light-extraction features 24 can be in the form of grooves formed across the surface of the LED chips 72 and 73. The grooves can be straight lines as depicted, or in other embodiments can be non-straight lines, or take the form of circles, squares, or any other shape. In FIG. 7D, the grooves of the light-extraction features 24 can be more densely spaced in the center, while in FIG. 7C the grooves are evenly distributed across the LED chip 72.

FIGS. 8A-8D depict exemplary light-extraction features according to aspects of the present disclosure.

Figure 8A:
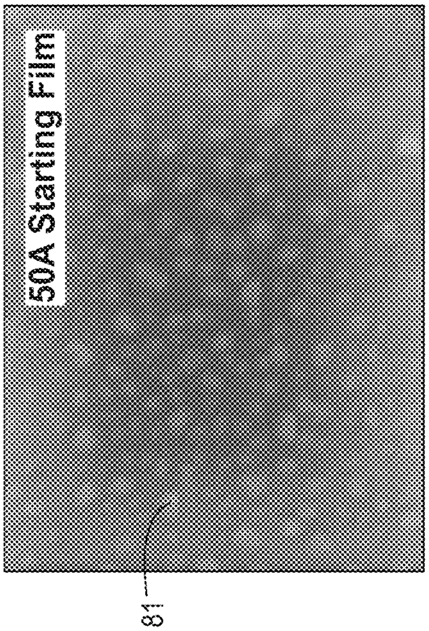
FIGS. 8A-8D depict exemplary light-extraction features according to aspects of the present disclosure.
Figure 8B:
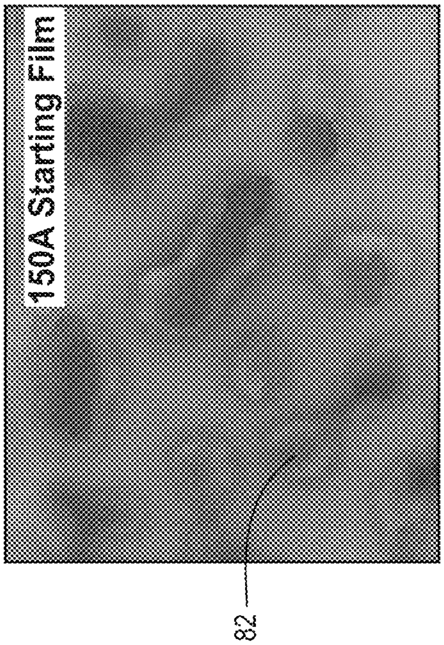
Figure 8C:
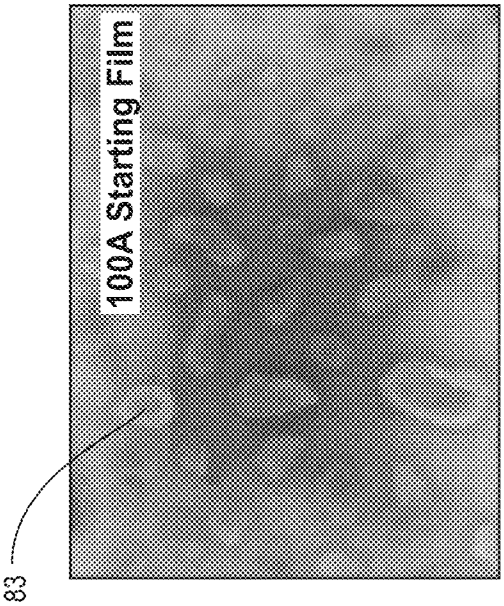
Figure 8D:
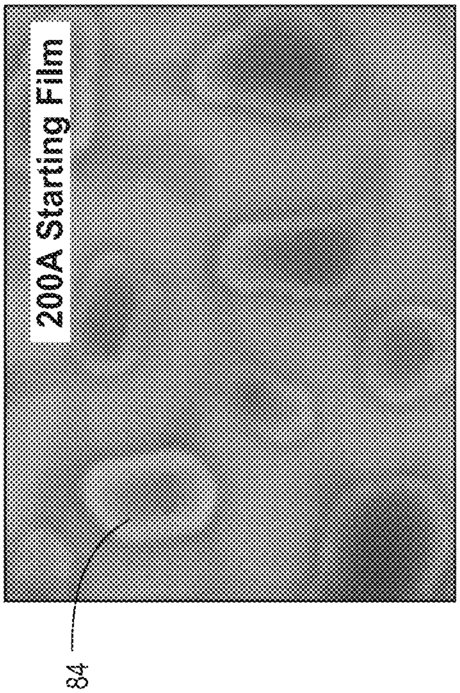

In an embodiment, the secondary, smaller light-extraction features can be formed without using a mask. For example, in FIGS. 8A-8D, thin films of Ag were deposited on the surface after the primary etching was done with the ultrafast laser to produce the light-extraction features 24. In FIG. 8A, a 50 A thick film of Ag was deposited, while in FIG. 8B a 150 A thick film was deposited, in FIG. 8C, a 100 A thick film, and in FIG. 8D a 200 A thick film was deposited. The wafers were then annealed at 400C, causing dewetting of the surface. Generally, the thicker the film, the larger the size of the light-extraction features 81, 82, 83, and 84. For example, light extraction feature 81 can have a diameter around 10-60 nm, while the light extraction feature 84 can have a diameter between 200-500 nm.

Figure 9:
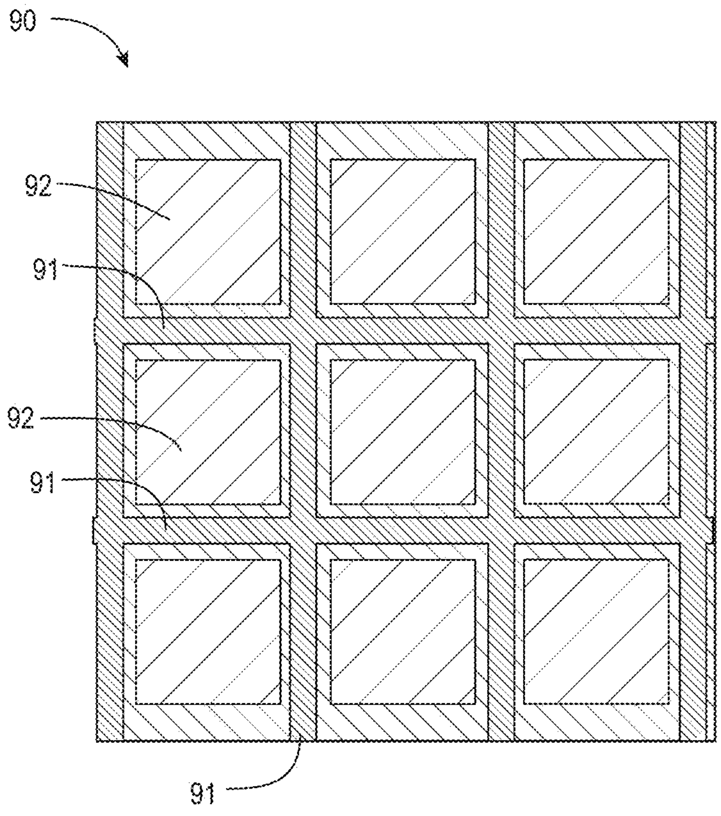
FIG. 9 is a generalized view from a bottom of a pixelated LED array with laser ablated trenches according to aspects of the present disclosure.

FIG. 9 is a generalized view from a bottom of a pixelated LED array with laser ablated trenches according to aspects of the present disclosure.

In addition to the ultrafast laser etching to create light-extraction features, the ultrafast laser can also be used to ablate sapphire substrates to remove material to alter the light emission characteristics of LED arrays. For example, an LED array 90 with a plurality of active layer portions 92 that can be configured to emit light can be grown on a sapphire substrate. To reduce the crosstalk and interference between the active layer portions 92, the sapphire substrate can be ablated to form trenches 91 between the active layer portions 92. The trenches can cause the LED array 90 to become pixelated, which can alter the light-emission characteristics of the LED array 90 to increase the contrast ratio between pixels.

Previously, when SiC based substrates were used, similar trenches were formed by various forms of wet or dry etching, but these techniques are not feasible with sapphire substrates. Sapphire substrates are desirable due to the hardness of the substrates, and the ability to handle higher power, high contrast LED matrixes—however, it was not feasible to etch the sapphire substrates with the existing wet and dry etch chemistries. The use of ultrafast laser etching to ablate the sapphire substrate to form the trenches 91 overcomes the previous challenges. The ultrafast laser also enables fine control of the depth and width of the trenches 91 by modulating the laser pulse spatial temporal width, focal region, power, and wavelength. Thus, the degree of LED optical isolation of each pixel in an array can be finely and individually controlled.

Figure 10:
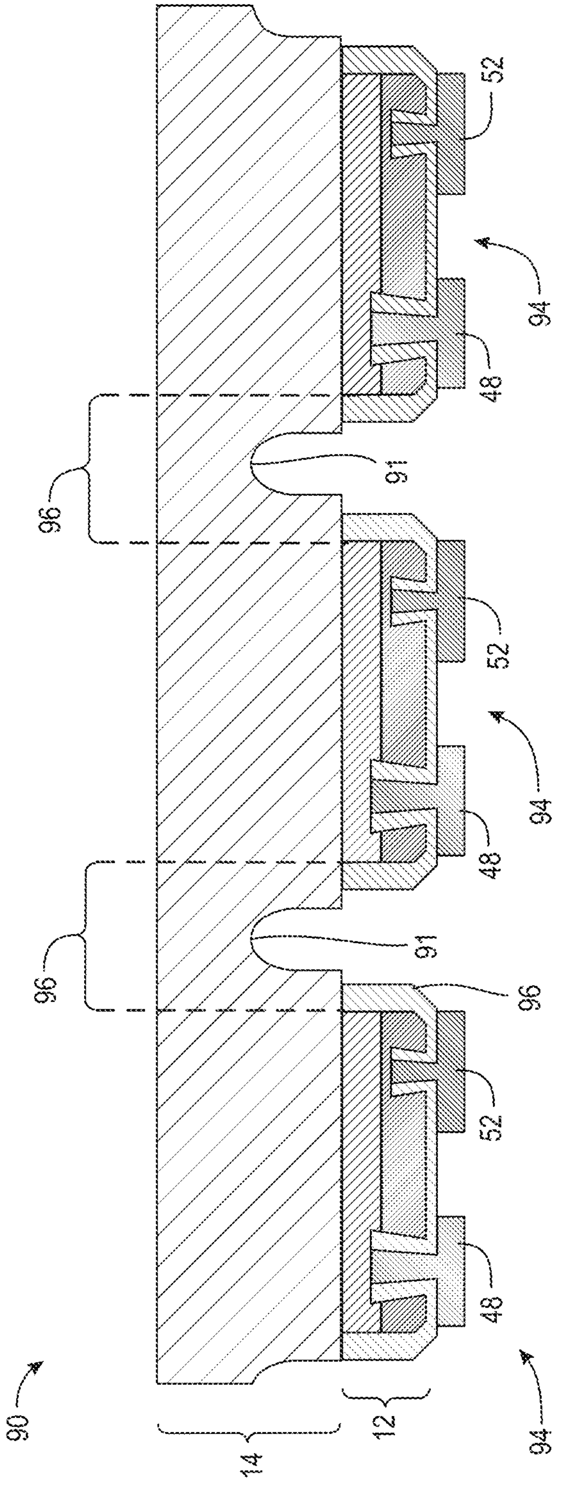
FIG. 10 is a cross-sectional view of a pixelated LED array with laser ablated trenches according to aspects of the present disclosure.

An example of the laser etching of a pixelated LED array 90 is shown in FIG. 10 which is a cross-sectional view of the pixelated LED array 90 with laser ablated trenches 91 according to aspects of the present disclosure.

The active LED structure 12 (e.g., active layer) can be grown on the substrate 14 and then a plurality of streets 96 or recesses can be formed in the active LED structure 12 to form the active layer portions 94 that are part of the pixelated LED array 90. The ultrafast etching can be performed on the substrate 14 on the same side of the LED array 90 as which the active LED structure 12 is formed. The trenches 91 formed by the ultrafast laser etching thereby provide some separation between the pixels, improving contrast and other light emission characteristics. The trenches 91 can be smaller in width than the streets 96. The depth and width of the trenches 91 can be modified based on the desired light emission characteristics.

Figure 11A:
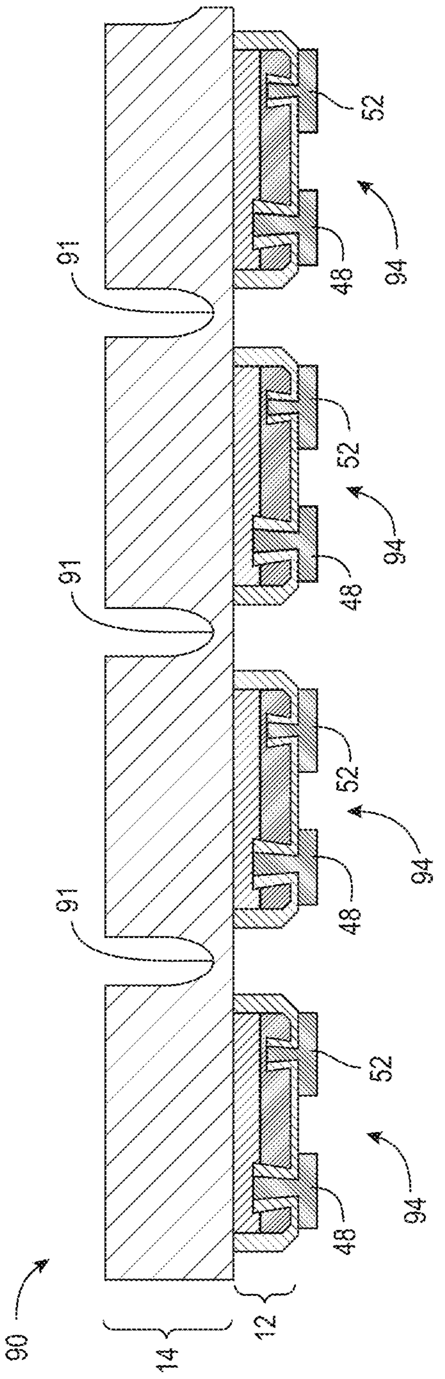
FIGS. 11A and 11B are cross-sectional views of a pixelated LED array with different laser ablated arrangements according to aspects of the present disclosure.
Figure 11B:
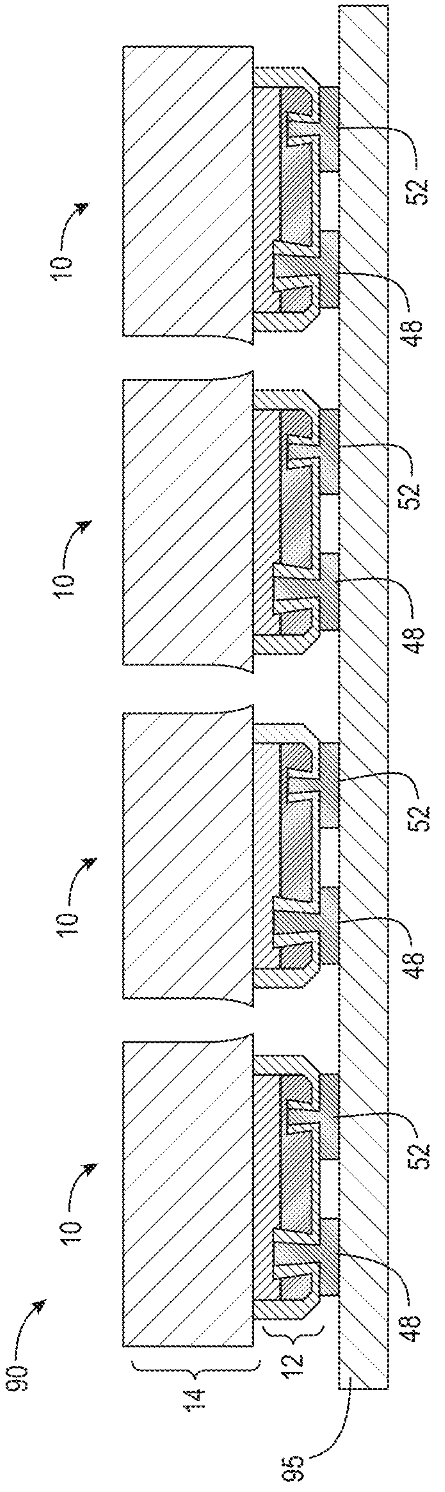

In other embodiments, such as in FIG. 11A, the trenches 91 can be formed on a side of the substrate opposite the side on which the active LED structure 12 is formed. Depending on the light emission characteristics desired and/or on the intended use of the LED array 90, the substrate between each pixel can be entirely ablated away as in FIG. 11B. Each separate LED chip 10 can be physically isolated from each other LED chip 10. In an embodiment, the LED array may first be mounted or fixed to a PCB layer 95 as monolithic unit and then subsequently be laser etched to fully isolate of the individual pixel/LED chips 10.

Figure 12:
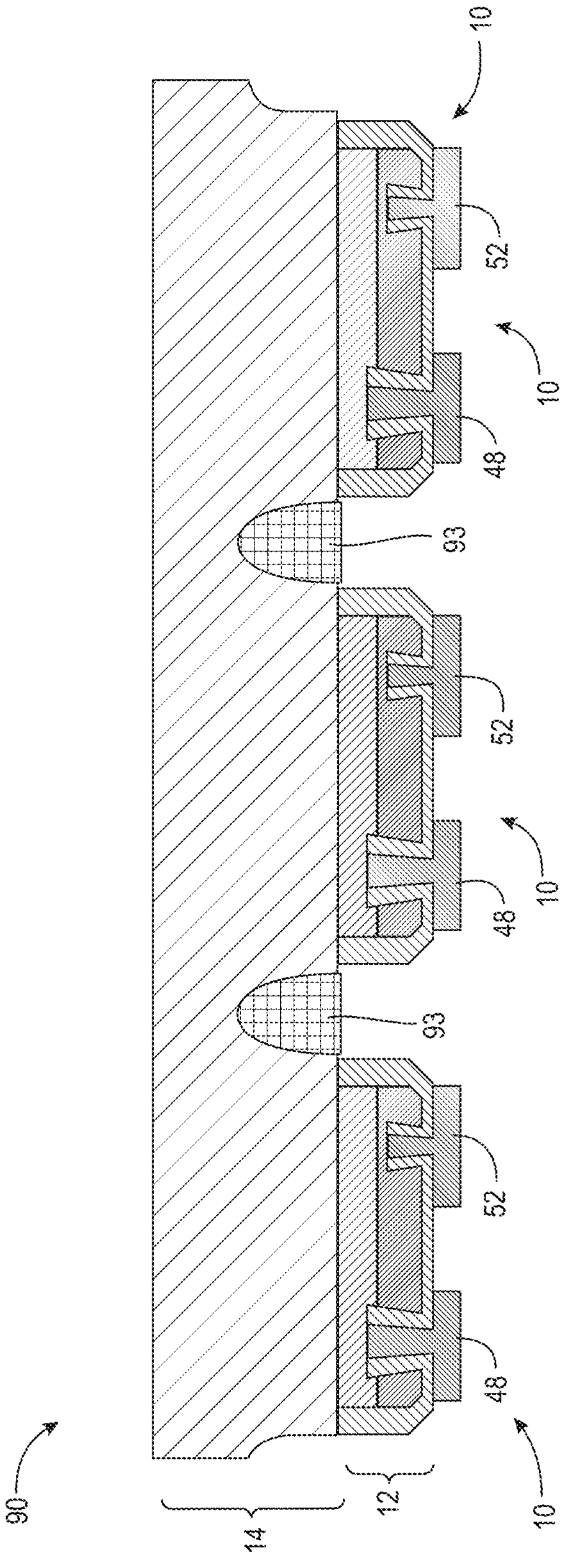
FIG. 12 is another cross-sectional view of a pixelated LED array with laser ablated trenches and a material with a light-altering property according to aspects of the present disclosure.

In other embodiments, such as in FIG. 12, a material 93 can be placed in the trenches 91, where the material 93 has light-altering properties, such as being reflective or absorptive to varying degrees. In some embodiments, multiple layers of different materials with different light-altering properties can be placed in the trench 91.

In addition to the laser etching to form the trenches 91, the ultrafast laser can also be used to form light-extraction features (e.g., 24 and 60) on a surface of the substrate 14 of the LED array 90.

Figure 13:
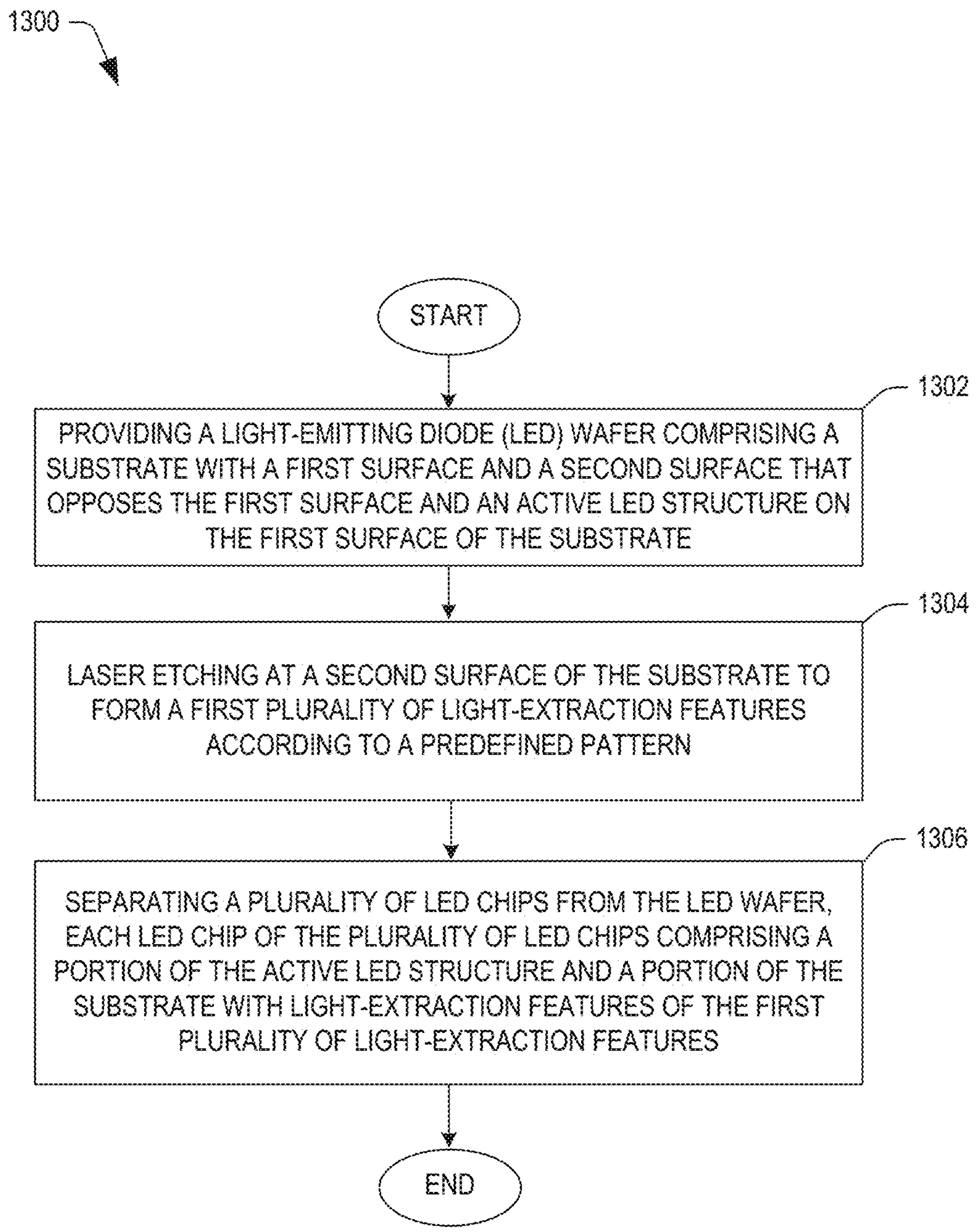
FIG. 13 is a flowchart of a method for fabricating an LED device with a laser etched light-extraction features on a substrate of the LED device according to aspects of the present disclosure.

FIG. 13 is a flowchart of a method for fabricating an LED device with a laser etched light-extraction features on a substrate of the LED device according to aspects of the present disclosure. The flowchart begins at step 1302 where the method includes providing a light-emitting diode (LED) wafer comprising a substrate with a first surface and a second surface that opposes the first surface and an active LED structure on the first surface of the substrate. In various embodiments, the substrate can be crystalline sapphire.

At step 1304, the method comprises laser etching at a second surface of the substrate to form a first plurality of light-extraction features according to a predefined pattern. In various embodiments, the substrate can be crystalline sapphire and after the laser etching, the first plurality of light-extraction features can include one or more deposits of amorphous sapphire. In an embodiment, the amorphous sapphire can be chemically etched, resulting in a second plurality of light-extraction features in each light-extraction feature of the first plurality of light-extraction features. In an embodiment, a width of the first plurality of light extraction features can be between 1 μm-10 μm and a width of the second plurality of light extraction features can be between 10 nm-500 nm. In an embodiment, the laser etching at the second surface of the substrate comprises laser etching an additional layer formed on the second surface of the substrate, the additional layer comprising at least one of glass, silicon nitride, silicone dioxide, and silicone.

At 1306, the method comprises separating a plurality of LED chips from the LED wafer, each LED chip of the plurality of LED chips comprising a portion of the active LED structure and a portion of the substrate with light-extraction features of the first plurality of light-extraction features.

Figure 14:
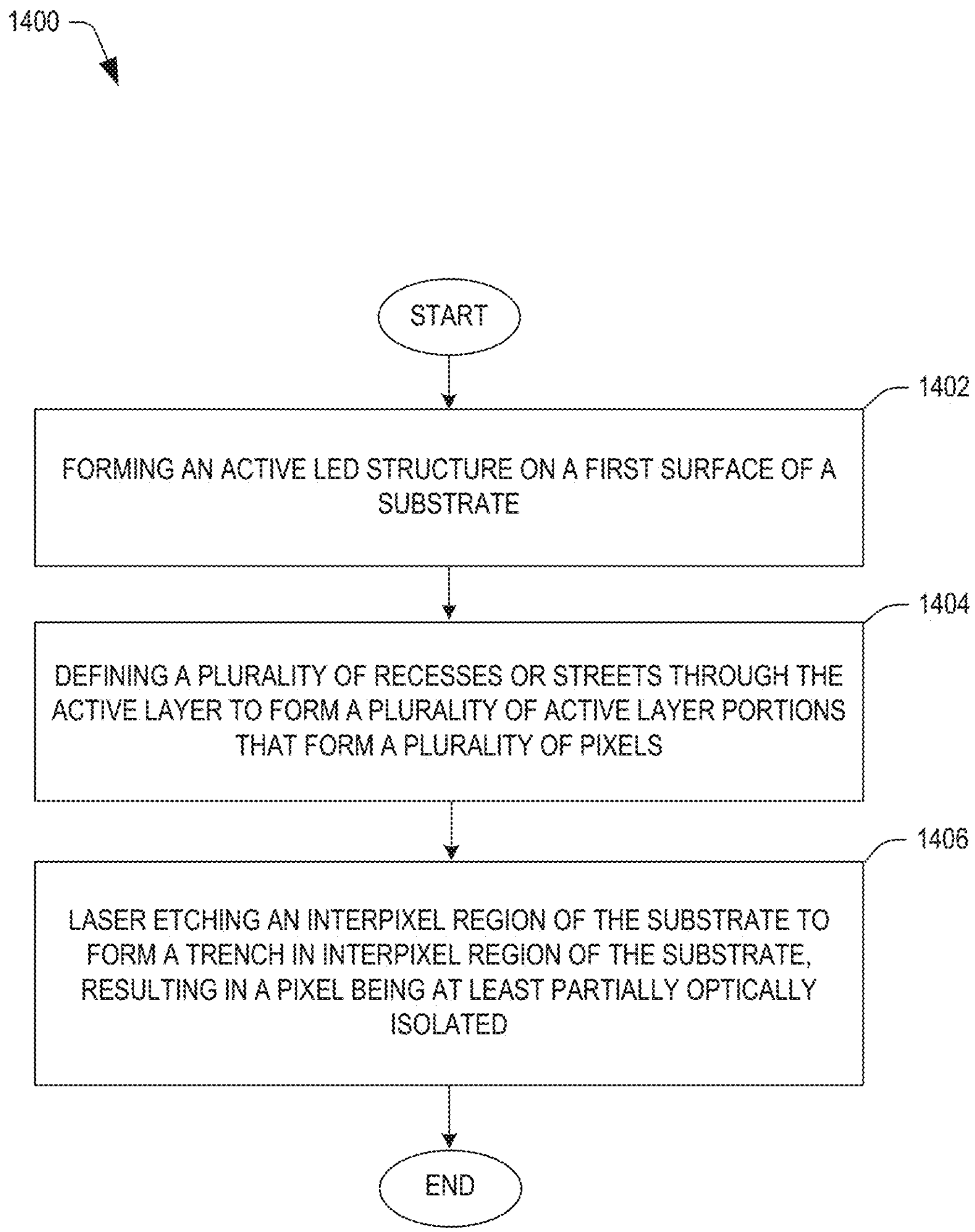
FIG. 14 is a flowchart of a method for fabricating a pixelated LED device according to aspects of the present disclosure.

FIG. 14 is a flowchart of a method for fabricating a pixelated LED device according to aspects of the present disclosure. The method begins at step 1402 where the method comprises forming an active LED structure on a first surface of a substrate.

At step 1404, the method includes defining a plurality of recesses or streets through the active layer to form a plurality of active layer portions that form a plurality of pixels.

At step 1406, the method includes laser etching an inter-pixel region of the substrate to form a trench in interpixel region of the substrate, resulting in a pixel being at least partially optically isolated. In an embodiment, the laser etching comprises laser etching the first surface of the substrate. In other embodiments, the laser etching comprises laser etching a second surface of the substrate opposite the first surface. In some embodiments, one or more layers of a material with light-altering properties, such as a reflective material, or an absorptive material, can be added to the trenches to further modify the light emission characteristics of the LED array.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A light-emitting diode (LED) chip comprising:

a substrate comprising a first surface and a second surface that opposes the first surface, the substrate comprising a thickness that is less than or equal to 500 microns (μm), wherein the substrate comprises crystalline sapphire;

an active LED structure on the first surface of the substrate, the active LED structure being configured to generate light that passes through the substrate when electrically activated; and a first plurality of light-extraction features according to a predefined pattern at the second surface of the substrate, each light-extraction feature of the first plurality of light-extraction features comprising a height and a width, and an average ratio of the height to the width for individual light-extraction features of the first plurality of light-extraction features is in a range from 0.3 to 1, wherein each light-extraction feature of the first plurality of light-extraction features comprises a second plurality of light extraction features formed from amorphous sapphire that are smaller than the first plurality of light-extraction features.

2. The LED chip of claim 1, wherein a width of the first plurality of light extraction features can be between 1 μm-30 μm.

3. The LED chip of claim 1, wherein a width of the second plurality of light extraction features can be between 10 nm-500 nm.

4. The LED chip of claim 1, wherein a distribution of the second plurality of light-extraction features is random.

5. The LED chip of claim 1, wherein the active LED structure comprises group III-Nitride semiconductor materials.

6. The LED chip of claim 1, wherein the predefined pattern comprises the first plurality of light-extraction features spread uniformly across the second surface of the substrate.

7. The LED chip of claim 1, wherein the predefined pattern comprises the first plurality of light-extraction features spread non-uniformly across the second surface of the substrate.

8. The LED chip of claim 1, wherein the predefined pattern comprises linear grooves across the second surface of the substrate.

9. The LED chip of claim 1, wherein the predefined pattern comprises linear grooves with non-uniform spacing between the linear grooves across the second surface of the substrate.

10. The LED chip of claim 1, wherein the predefined pattern comprises a first region of the second surface of the substrate with a first density of light-extraction features and a second region of the second surface of the substrate with a second density of light-extraction features different than the first density.

11. The LED chip of claim 1, wherein the substrate is 500 μm thick when the light emitted by the LED chip is between 220-320 nm.

12. The LED chip of claim 1, wherein the substrate is 150 μm thick when the light emitted by the LED chip is between 400-550 nm.

* * * * *